United States Patent
Nazarian et al.

(10) Patent No.: US 7,535,767 B2
(45) Date of Patent: May 19, 2009

(54) READING MULTI-CELL MEMORY DEVICES UTILIZING COMPLEMENTARY BIT INFORMATION

(75) Inventors: Hagop Nazarian, San Jose, CA (US); Michael Achter, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 127 days.

(21) Appl. No.: 11/834,420

(22) Filed: Aug. 6, 2007

(65) Prior Publication Data

US 2009/0040839 A1    Feb. 12, 2009

(51) Int. Cl.
*G11C 11/34* (2006.01)
*G11C 16/04* (2006.01)
*G11C 16/06* (2006.01)

(52) U.S. Cl. .................. 365/185.22; 365/185.02; 365/185.03; 365/185.2

(58) Field of Classification Search ............ 365/185.02, 365/185.03, 185.21, 185.22
See application file for complete search history.

(56) References Cited

U.S. PATENT DOCUMENTS

| | | | |
|---|---|---|---|
| 6,807,097 B2 * | 10/2004 | Takano et al. | 365/185.03 |
| 6,870,768 B2 * | 3/2005 | Cernea et al. | 365/185.03 |
| 7,366,022 B2 * | 4/2008 | Li et al. | 365/185.22 |
| 2007/0147113 A1 * | 6/2007 | Mokhlesi et al. | 365/185.03 |

* cited by examiner

*Primary Examiner*—Ly D Pham
(74) *Attorney, Agent, or Firm*—Amin, Turocy & Calvin, LLP

(57) ABSTRACT

Providing differentiation between overlapping memory cell bits in multi-cell memory devices is described herein. By way of example, select groups of memory cells of the multi-cell memory devices can be iteratively disabled to render state distributions of remaining, non-disabled memory cells, non-overlapped. System components can measure distributions rendered non-overlapped to uniquely identify states of such distributions. Identified state distributions can subsequently be disabled to render other state distributions non-overlapped, and therefore identifiable. In such a manner, read errors associated with overlapped bit states of multi-cell memory devices can be mitigated.

20 Claims, 14 Drawing Sheets

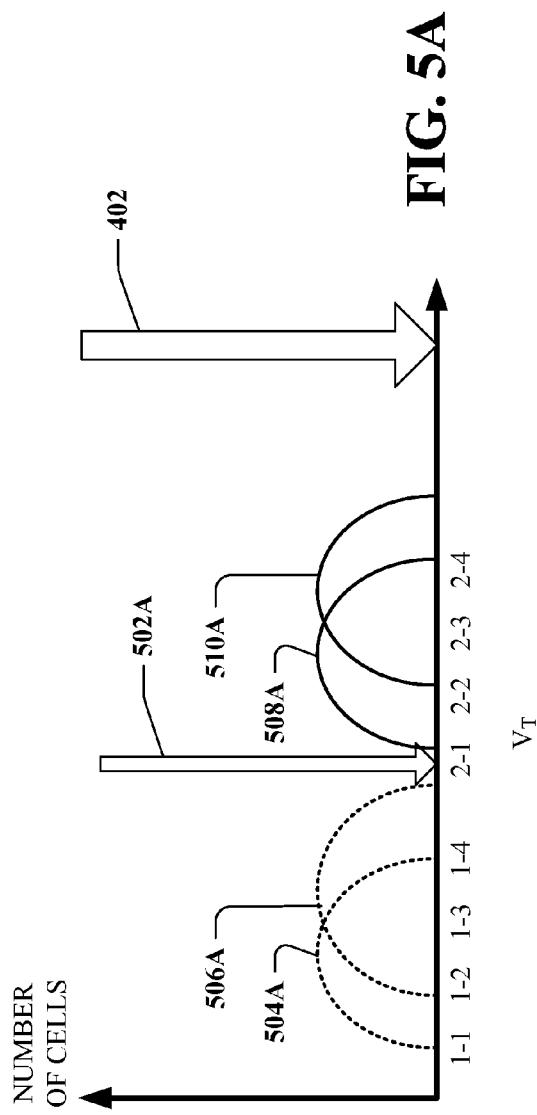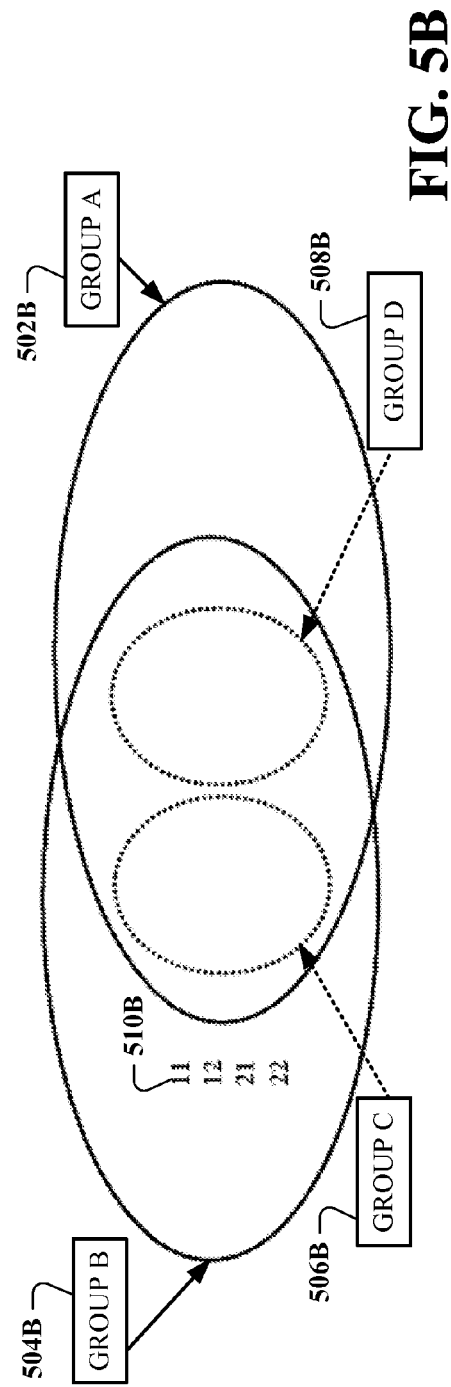

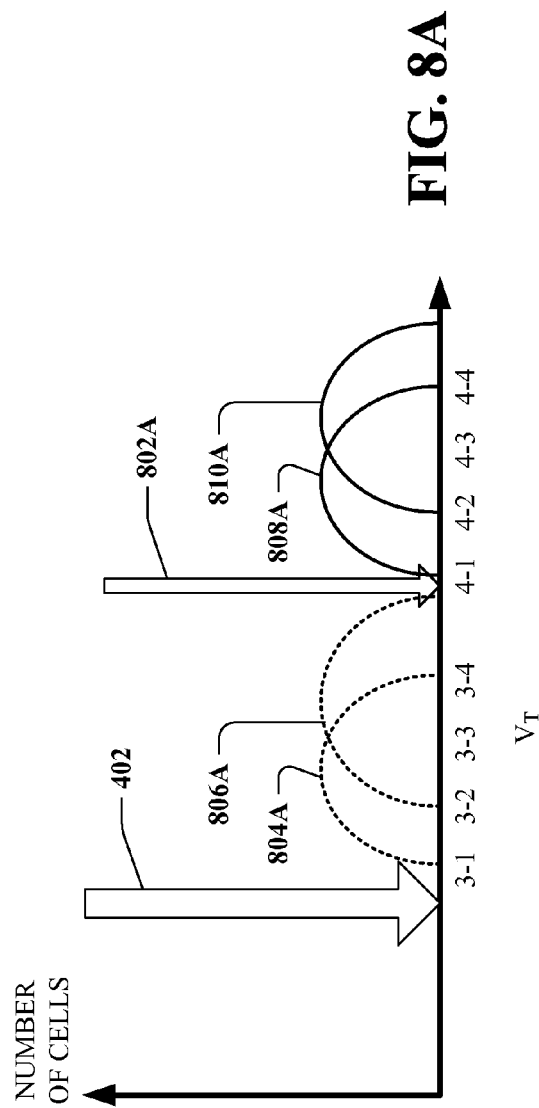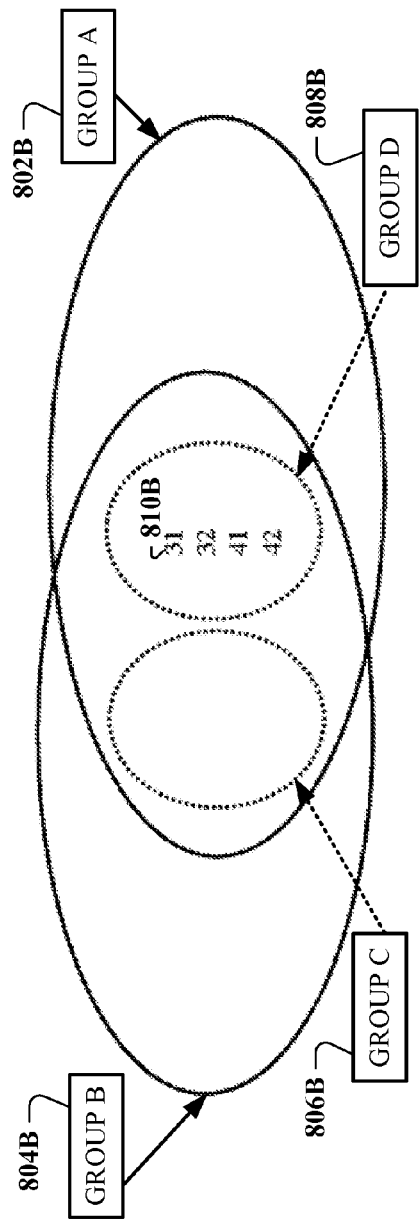

READING MULTI-CELL MEMORY DEVICES UTILIZING COMPLEMENTARY BIT INFORMATION

CROSS-REFERENCE TO RELATED APPLICATION

This application is related to co-pending U.S. application Ser. No. 11/687,436, filed Mar. 16, 2007, entitled "DIVISION-BASED SENSING AND PARTITIONING OF ELECTRONIC MEMORY." The entirety of this application is incorporated herein by reference.

BACKGROUND

Memory devices have a wide variety of uses in modern electronic devices, including devices such as cellular phones, personal computers, laptops, personal digital assistants, camcorders, voice records, portable storage drives for such devices, and the like. As memory devices become smaller, less expensive to manufacture, and capable of storing larger amounts of information, they become viable products for larger segments of the consuming public. Consequently, as the demand and market for such devices increase, additional types of such memory devices are developed to accommodate those markets. Flash memory, for example, is one type of electronic memory media that can store, erase and restore data. Furthermore, flash memory, unlike some types of electronic memory, can retain stored data without continuous electrical power. Flash memory has become a popular device for consumer electronics, due in part to a combination of the high density and low cost of erasable programmable read only memory (EPROM) and electrical erasability introduced with electronically erasable programmable read only memory (EEPROM). In addition to combining these benefits, flash memory is nonvolatile (e.g., flash memory can be removed from a power source without losing stored data). Consequently, it has become a useful and popular mechanism for storing, transporting, sharing and maintaining data.

To further evolve technical capabilities associated with flash memory devices, multiple storage cells have been implemented therewith. Multiple storage cells associated with a flash memory device can typically increase a density and consequently a storage capacity of such device. For example, a dual storage technology enables a single flash memory transistor to store two data bits. Some side effects can result from multi cell devices, however, as a bit (e.g., represented by a quantized voltage or current level) stored in one cell can affect a voltage or current level, representing a particular bit, of an adjacent cell. In some situations electrical characteristics associated with two different bits of a memory cell can overlap, making those bits difficult to distinguish. Such a condition can produce a memory read error resulting from an inability to distinguish between two or more bit states associated with a cell. To increase reliability and accuracy associated with flash memory, read errors should be reduced or eliminated where possible. Consequently, semiconductor supplies have invested resources in improving the accuracy and reliability associated with flash memory to comply with increasing quality requirements associated with such devices.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter provides for differentiating between overlapping memory cell bits in a multi-cell memory device. In accord with aspects of the claimed subject matter, select groups of memory cells are iteratively disabled to distinguish states of overlapping memory cell state distributions. System components can measure distributions rendered non-overlapped to uniquely identify states of such distributions. Identified state distributions can subsequently be disabled to render other state distributions non-overlapped, and identifiable. In such a manner, read errors associated with overlapped bit states of multi-cell memory devices can be mitigated.

In accord with additional aspects of the claimed subject matter, overlapping bit state distributions associated with a plurality of multi-cell memory devices can be distinguished via comparison with a reference. Groups of complementary memory cells of the plurality of multi-cell devices can be initially distinguished with respect to a first reference point chosen at one or more non-overlapped points. Memory cells can be grouped based at least in part upon an aspect of a cell and/or of a complementary cell in relation to the first reference point. One or more such groups can subsequently be disabled to render cells of remaining groups distinguishable with respect to the first and/or additional reference points. By iteratively disabling groups and measuring remaining groups of memory cells, states of overlapping memory cell state distributions can be distinguished to facilitate accurate reading of the plurality of multi-cell memory devices.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and novel features of the disclosed subject matter will become apparent from the following detailed description of the innovation when considered in conjunction with the drawings.

BRIEF DESCRIPTION OF THE DRAWINGS

FIGS. 5A and 5B illustrate exemplary diagrams of state distributions rendered non-overlapped in accord with embodiments of the subject innovation.

FIGS. 8A and 8B depict further sample diagrams of state distributions rendered identifiable by disablement of cells corresponding to overlapping state distributions.

DETAILED DESCRIPTION

Figure 1:
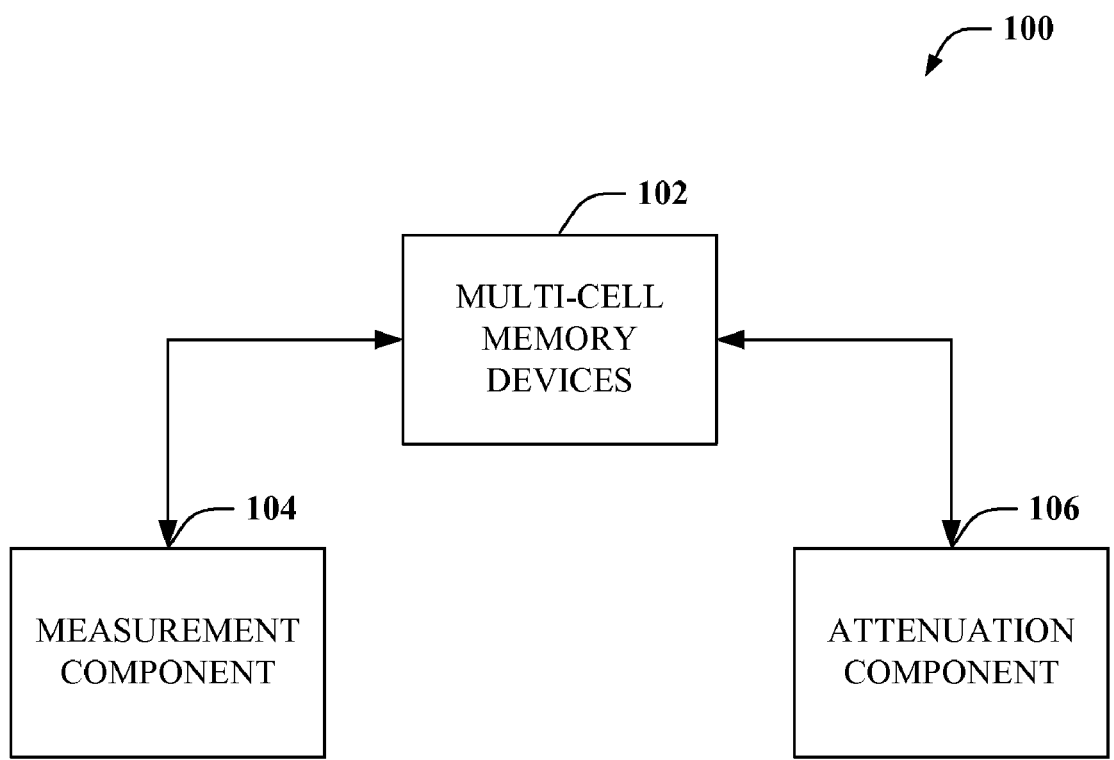
FIG. 1 depicts an example high-level block diagram of a system that can distinguish a state of an overlapped state distribution of a plurality of multi-cell memory devices in accord with the subject innovation.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

As utilized herein, terms "component," "system," "interface," "engine," and the like are intended to refer to a computer-related entity, either hardware, a combination of hardware and software, software (e.g., in execution), and/or firmware. For example, a component can be a process running on a processor, a processor, an object, an executable, a program, and/or a computer. By way of illustration, both an application running on a server and the server can be a component. One or more components can reside within a process and/or thread of execution and a component can be localized on one computer and/or distributed between two or more computers. As another example, an interface can include I/O components as well as associated processor, application and/or API components, and can be as simple as a command line or a more complex Integrated Development Environment (IDE).

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications may be made to this configuration without departing from the scope or spirit of the claimed subject matter.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

The disclosed subject matter relates to systems and/or methods that facilitate accurately retrieving data in multi-bit, multi cell memory devices (e.g., quad-bit, dual cell non-volatile flash memory). In accordance with aspects of the claimed subject matter, a measurement component can measure memory cells and complementary cells to determine a relative state of such cells with respect to an initial reference point. Subsequently, a disablement component can iteratively disable select groups of memory cells to render other groups of such cells non-overlapped. By iteratively choosing, disabling, and identifying various groups of memory cells, states of overlapping state distributions of a plurality of multi-cell memory devices can be distinguished to facilitate accurate retrieval of data stored within such plurality of devices.

With reference to FIG. 1, an example high-level block diagram of a system 100 is depicted that can distinguish a state of an overlapped state distribution of a plurality of multi-cell memory devices 102 (e.g., a multi-bit, multi-cell device such as a quad-bit dual cell device, or the like) in accord with aspects of the subject innovation. Multi-cell memory device(s) 102 can include non-volatile memory, such as flash memory, read only memory (ROM), programmable ROM (PROM), erasable programmable read only memory (EPROM), electronically erasable programmable read only memory (EEPROM), and the like. As an example, multi-cell memory device 102 can include non-volatile memory (e.g., flash memory, multi-bit flash memory, and like memory) that further includes multi-level, multi-bit flash memory cells.

System 100 can include a measurement component 104 that can determine a concurrent program level (e.g., level of charge, current, voltage, or the like) of a memory cell or group of memory cells of the multi-cell memory devices 102. Measurement component 104 can include, for example, an electric current meter, charge meter, voltage meter, or like device, electrical process or microprocessor, or combination thereof, that can identify and distinguish electrical characteristics (e.g., current, charge, voltage, resistance etc.) associated with an electronic component (e.g., multi-cell memory devices 102). Memory cell devices (102) can often exhibit overlapping state distributions as a result of a complementary bit disturbance phenomenon. Complementary bit disturbance can occur as a result of adjacent cells, or mirror cells, programmed to different program levels. More specifically, in a mirror bit (dual cell) device, two corners of a single transistor can each hold a memory cell. These two memory cells each share a single poly gate. Consequently, they are physically part of a single, non-volatile transistor located at two edges of the same gate. As a result of this physical arrangement, a charge, current, voltage, or the like, programmed to such adjacent cells can partially average between the cells. Such averaging can result in program levels of each cell being shifted away from a default program level, and toward a program level of an adjacent cell (see, e.g., FIG. 4A for a detailed depiction of shifted cell distributions as a result of complementary bit disturbance).

Complementary bit disturbance, as described above, can typically occur when cells are programmed. A high degree of disturbance can occur when a cell is programmed to a highest program level (e.g., high $V_T$ level, current level, etc.) and an adjacent cell is programmed at a lowest level, or an un-programmed level, for instance. Such disturbance can increase as memory devices (102) are stressed under operating conditions (e.g., rapid reading, writing, and erasing procedures, corresponding to rapidly changing the charge, current, voltage, etc., levels of memory cells) or simulation conditions. Conventional techniques for reading memory cell data can typically measure and identify a concurrent program level of a memory cell or group of memory cells so long as states of such cells do not overlap. However, once states and/or state distributions begin to overlap and become indistinguishable from each other (e.g., due to data retention or like circumstances), read errors can occur resulting in potential data corruption and/or data loss.

Measurement component 104 can identify one or more non-overlapping points between multiple overlapping state distributions and classify measured states and/or distributions with respect to such non-overlapping point (see, e.g., FIG. 4 infra for a depiction and description with respect to points between overlapping state distributions). As a specific example to provide context for aspects of system 100, a group of quad-bit multi-cell devices (102) can have four memory cell program levels corresponding to four $V_T$ states, e.g., B1, B2, B3, and B4 states (see infra). If state distributions of groups of cells overlap, a measurement component 104 can measure $V_T$ program levels of such cells (e.g., a measured $V_T$ level can indicate a program level plus a perturbation caused by complementary bit disturbance, bit shifting as a result of operating or simulation stress, or the like) and identify non-overlapping regions. As a more specific example, if program levels between the B2 and B3 states do not overlap, even though the B1 and B2 states overlap, and the B3 and B4 states overlap, measurement component 104 can classify each group of cells and cells adjacent thereto as B2 or below, or B3 and above, for instance. As an alternate example, if a non-overlapping point exists between B3 and B4 levels (despite, for instance, levels B1, B2, and B3 overlapping), measurement component 104 can classify cells and adjacent cells as corresponding to a B3 state or below, or as a B4 state, or the like.

Attenuation component 106 can iteratively disable, suppress, inhibit, or the like, one or more programmed cells of multi-cell memory devices 102 (e.g., that correspond to overlapping states), wherein an iteration of such cells renders at least one program state non-overlapped. For instance, limiting or otherwise restricting electrical power to such devices, or similar technique, can disable programmed cells. As a specific example, disabling all cells that correspond with a 1 or a 2 state (e.g., as measured by measurement component 104), or cells adjacent to a cell that corresponds to the 1 or 2 state, or both, can render program states 3 and/or 4 non-overlapped. As a result, measurement component 104 can verify a state for cells corresponding to the 3 and 4 program states (e.g., by distinguishing 3 and 4 state cells from each other and from cells corresponding to 1 and 2 states, or cells adjacent to such 1 and 2 state cells). Likewise, disabling cells that correspond to a 3 or 4 state, or cells adjacent thereto, or both, can render cells programmed to a 1 or 2 state non-overlapped and distinguishable.

It should be appreciated that multi-bit memory cells (e.g., multi-cell memory devices (102)) as utilized within the subject disclosure can typically be programmed to multiple target levels that can represent multiple data bits. As a more specific example, a quad-bit cell can be programmed to four discreet levels (e.g., B1, B2, B3, B4) corresponding to varying amounts of voltage (e.g., $V_T$) stored within a memory cell. Furthermore, a B1 level can correspond to a first programmed state (that, e.g., can be a lowest amount of voltage, a default voltage level or an un-programmed state, or combinations thereof), and subsequent levels, such as B2, can correspond to a programmed state having voltage higher than B1. Additionally, B3 can correspond to a programmed state having voltage higher than B1 and B2, and B4 can correspond to a highest programmed state having voltage still higher than B1, B2, and B3.

Each bit level (e.g., B1 through B4) of a multi-bit device can correspond to different digital information, or data. Consequently, as a cell is programmed to a particular level (e.g., $V_T$, charge, current, etc.), and changed to a different program level or to the lowest program level (e.g., an un-programmed level, default program level, or the like), writing, re-writing, and erasing, respectively, of data to multi-bit memory cell 102 can be effectuated. Furthermore, an amount of voltage stored therein (e.g., $V_T$) can be measured and compared to discreet threshold levels (e.g., B1 through B4), or states, that correspond to different data, to effectuate reading data stored within multi-bit memory cell 102.

In accord with aspects disclosed herein, multi-cell memory devices (102) described in the subject specification can include two or more adjacent memory cells that can be independently programmed to different bit levels. For example, two adjacent cells of multi-cell memory devices 102 can be programmed to an appropriate level (e.g., electric charge, current, voltage, or the like) representing data bit levels B1 and B2 respectively (hereinafter referred to as B1-B2 or a B1-B2 state with respect to adjacent cells, where B1 refers to a state of a first cell or group of cells having a lowest $V_T$, and B2 refers to a state of a second, adjacent cell or group of cells having a slightly higher $V_T$; it should be noted that the same B1-B2 program state is also a B2-B1 state viewed with respect to the second, adjacent group of cells). As stated above, B1-B2 can indicate an un-programmed state in one memory cell and a first programmed state in an adjacent memory cell, for instance. Typically, multi-cell memory devices (102) can exhibit a complementary bit disturbance phenomenon, where a typical bit level (e.g., $V_T$, level of charge, etc.) of one cell can be perturbed and shifted by a programmed bit level of an adjacent cell (e.g., when differing values in adjacent cells partially average their respective values). More specifically, complementary bit disturbance can cause a programmed bit level of one cell to deviate from a predetermined level typically associated with the programmed bit level.

The following example illustrates a complementary bit disturbance phenomenon applicable to one or more multi-bit, multi-cell memory devices (102) as described above (e.g., see FIG. 4 for a detailed depiction of disturbed cell distributions of B1, B2, B3, and B4 program states of an example dual-cell, quad-bit memory device). For this example, a bit level B1 (e.g., see reference numbers 404A-410A of FIG. 4) typically corresponds to an amount of voltage (e.g., $V_T$) between 5 and 7 and a bit level B2 (e.g., see reference numbers 412A-418A of FIG. 4) typically corresponds to an amount of voltage between 9 and 11. A first cell programmed to a B1 level and an adjacent cell programmed to a B2 level can, for instance, result in bit disturbance, such that an actual $V_T$ stored within the first cell is greater than the typical 5-7 range (e.g., 8), or an actual $V_T$ stored within the second cell is less than the typical 9-11 range (e.g., 8), or both. More specifically, a B1-B2 (e.g., see the 1-2 distribution 406A of FIG. 4) state can result in a bit level associated with the first memory cell between 6 and 8, a B1-B3 (e.g., 408A) state in a bit level between 7 and 9, and a B1-B4 state in a bit level between 8 and 10. As a result, it can be difficult to differentiate between certain bit levels, as illustrated by this example, if a shifted level nears a level corresponding to a different bit level (e.g., if $V_T$ of the first cell overlaps the 9-11 range associated with a B2 level, such as the 7-9 and 8-10 $V_T$ levels indicated by the B1-B3 and B1-B4 states, respectively).

It should be appreciated that the specific embodiments provided by the foregoing example are not to be construed so as to limit the disclosure. Instead, like embodiments known to one of skill in the art or made known to one of skill in the art through the context provided by this example are incorporated herein. Specifically, that other electronic values such as charge or current can be utilized for programming and sensing states of memory cells as described herein, and such values can have proportional or inverse proportional distributions, as appropriate.

Figure 2:
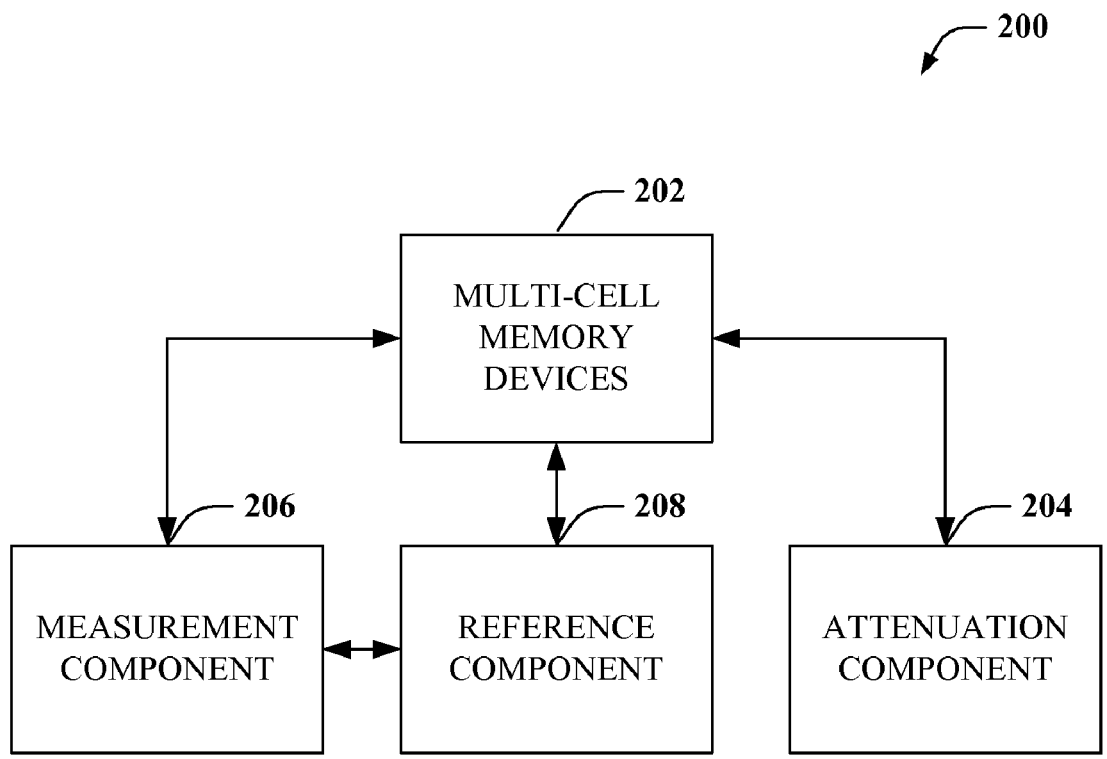
FIG. 2 illustrates an exemplary block diagram of a system that can utilize a reference and distinguish overlapping state distributions of memory cell devices in accord with various aspects disclosed herein.

FIG. 2 illustrates an exemplary block diagram of a system 200 that can utilize a reference and distinguish overlapping state distributions of memory cell devices in accord with various aspects disclosed herein. More specifically, system 200 can disable select memory cells of multi-cell memory devices 202 to render bit states of other cells non-overlapped, and therefore distinguishable. An attenuation component 204 can iteratively disable selected memory cells (e.g., by attenuating electrical power to a cell or group of cells, and/or corresponding multi-cell memory device(s) (202)), wherein an iteration of disabled cells can render at least one state distribution of one program state non-overlapped by state distributions of other program states.

As an example, a plurality of quad-bit, dual-cell memory devices can have four state distributions associated with each of four program states, B1, B2, B3, and B4, for a total of 16 state distributions (see, e.g., FIG. 4 for more detail). A first program state, B1, can be associated with B1-B1, B1-B2, B1-B3, and B1-B4 state distributions, which can correspond to measured bit levels of a group of cells programmed to a B1 state (e.g., a first or lowest level of programmed charge, current, voltage, etc.) that also have adjacent cells in any of the four possible (e.g., B1-B4) program states. Thus, attenuation component 204 can render at least one state distribution of one program state (e.g., a B1-B4 state distribution of a B1 state) non-overlapped by state distributions of other program states (e.g., a B2-B1 state distribution corresponding to a group of cells programmed to a B2 state, and having adjacent cells programmed to a B1 state) by disabling select groups of memory cells.

System 200 can further verify a state of programmed cells that correspond to a particular state distribution and/or program state by measuring a concurrent program level of such cells and comparing measured levels to a reference (e.g., a dynamic reference, such as a searching or tracking reference, or a constant reference, such as a constant bit, non-varying voltage or current level, or the like). Measurement component 206 can include, for instance, a device, process, or processor, or combination thereof (e.g., a current meter, charge meter, voltage meter, or the like or combination thereof) that can determine an electrical characteristic (e.g., current, charge, voltage, etc.) associated with one or more memory cells of multi-cell memory devices 202. A determined program level of one or more memory cells can be correlated with a default program state associated with such memory cells. More specifically, a reference component 208 can choose a reference (e.g., a constant bit level, such as a charge, voltage, current, etc., of a cell or group of cells of multi cell memory device(s) 102) between default program states (e.g., represented by B1-B1, B2-B1, B3-B1, or B4-B1 state distributions, or like default characterization of program states) of multi-cell memory devices 202. Measurement component 206 can compare the determined program levels to one or more such references, thereby verifying a program state of associated memory cells relative to the reference (and, e.g., relative to a corresponding default program state).

As an example, a reference provided by reference component 208 can include a constant measurable current, a non-varying bit, an experimentally determined level, a bit level inferred from another bit level or other information related to a memory device (202), or combinations thereof. Reference component 208 can choose one or more such references between non-overlapping portions of active (e.g., non-disabled) memory cell state distributions (e.g., between a B1-B2 state and a B2-B1 state, etc.) For instance, a reference can be chosen between state distributions rendered non-overlapped by attenuation component 206. Additionally, reference component can iteratively choose various reference points between various state distributions rendered non-overlapped by iterations of disabled memory cells. Consequently, measurement component 206 can verify a state of each state distribution (and/or group of state distributions) rendered non-overlapped by attenuation component 204. As a result, system 200 can iteratively verify states of overlapping state distributions of multi-cell memory devices 202, potentially verifying states of all memory cells of such devices.

Figure 3:
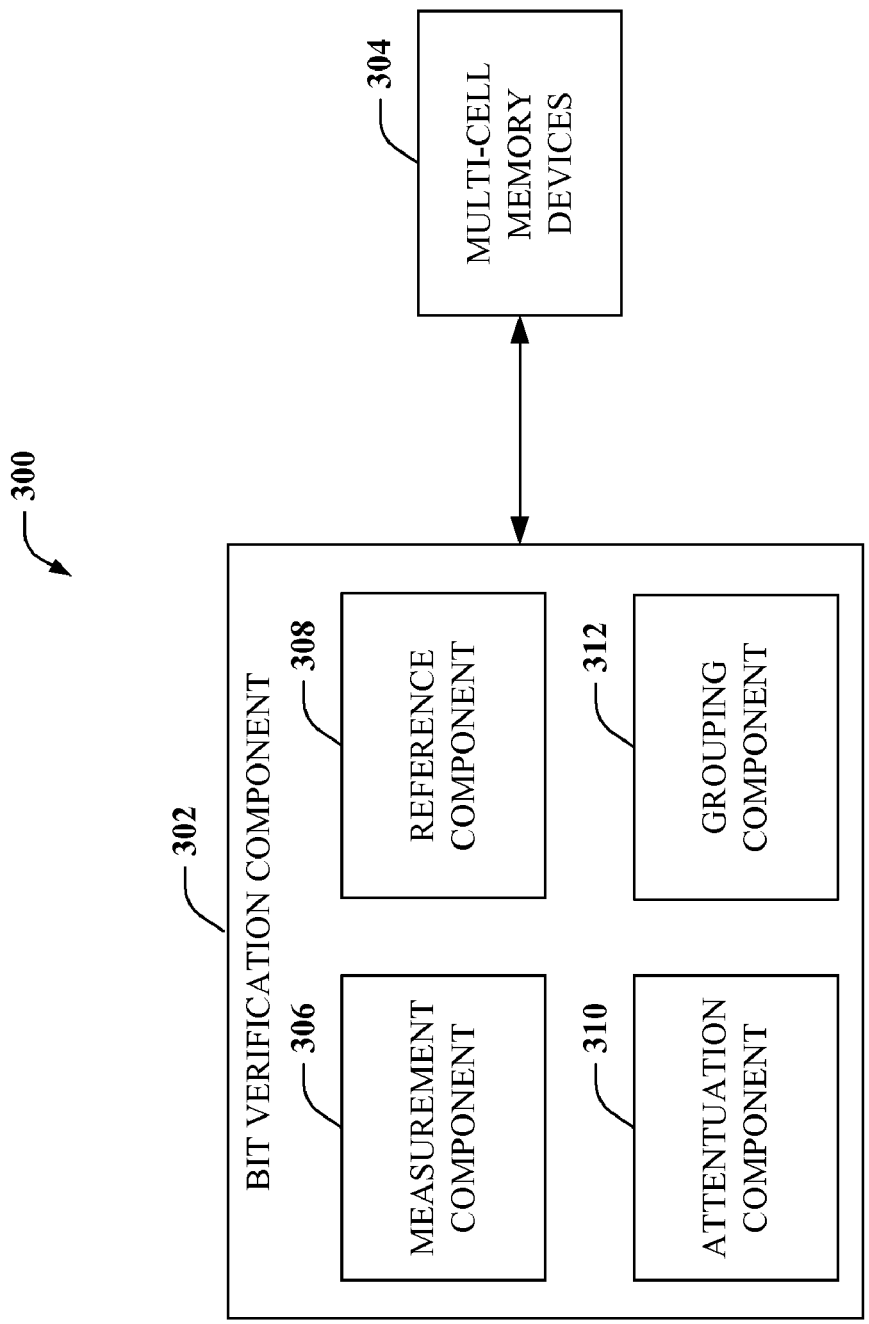
FIG. 3 depicts a sample block diagram of a system that can verify a bit state of one or more memory cells by disabling cells and/or complementary cells in accord with aspects of the claimed subject matter.

FIG. 3 depicts a sample block diagram of a system 300 that can verify a bit state of one or more memory cells by disabling cells and/or complementary cells in accord with aspects of the claimed subject matter. A bit verification component 302 can interface with a plurality of multi-cell memory devices 304 to measure cells of such devices and verify a program state corresponding to each cell. Multi-cell memory devices 304 can be any suitable memory devices (e.g., quad-bit, dual cell memory chip, or the like) capable of storing, erasing, and re-storing digital information (e.g., as related to one or more digital bits characterized by distinct electrical parameters, such as charge, current, voltage, etc., stored within a memory cell). Bit verification component 302 can be incorporated within an electronic hardware package that also contains multi-cell memory devices 304, for instance. As such, bit verification component 302 can be in direct or indirect electronic interface with such devices 304. Alternatively, or in addition, bit verification component 302 can be a separate device and/or process utilizing a remote wired and/or wireless (e.g., radio frequency, microwave frequency, optical frequency, or the like wireless communication mechanisms, or combinations thereof) interface with such multi-cell memory devices 304.

In accord with additional aspects described herein, system 300 can determine program levels of memory cells, compare such program levels to one or more references, and verify a program state of such cells. Measurement component 306 can determine a concurrent program level (e.g., level of charge, current, voltage, or other level corresponding to a digital piece of information, or bit) of each cell of multi-cell memory devices 304 and derive state distributions (illustrated at FIGS. 4, 5 and 6, infra) from such program levels. Reference component 308 can identify non-overlapping regions between determined program levels (and, e.g., corresponding state distributions) and choose reference points that correspond with the non-overlapping regions. Measurement component 306 can compare determined cell levels to one or more references to classify state distributions that do not overlap distributions of at least one other state (e.g., state distributions corresponding to a 1 or 2 state that do not overlap distributions of a 3 or 4 state can be classified as such, even if they are not uniquely verified as either a 1 state or a 2 state), and to verify a unique state of cells that do not overlap distributions of any other state.

As a particular example to provide context for aspects of system 300, for a plurality of quad-bit, dual cell memory devices (304), at least one distribution of a first program state overlaps at least one distribution of a second program state, and at least one distribution of a third program state overlaps at least one distribution of a fourth program state. Additionally, distributions of the first and second program states do not overlap any distributions of the third and fourth program states and vice versa (e.g., see FIG. 4 for illustration). Measurement component 306 can determine program levels of memory cells of the dual cell memory devices (304). Reference component 308 can identify non-overlapping regions between program levels and state distributions determined by measurement component 306, and choose a reference pertinent to such regions. In the context of this example, reference component 308 can choose a reference between distributions of the second and third program states. Measurement component 306 can subsequently compare determined program levels of the memory cells with such reference, and at least classify each cell as corresponding to the first or second state, or to the third or fourth state. Because a state distribution of each state overlaps at least one state distribution of another state (e.g., because a first state distribution overlaps at least one second state distribution, and vice versa, and because a third state distribution overlaps at least one fourth state distribution, and vice versa), measurement component 306 cannot uniquely verify a state of each cell and related state distribution.

Attenuation component 310 can iteratively disable groups of memory cells of multi-cell memory devices 304, wherein an iteration of disabled cells renders at least one program state non-overlapped. Disabling can be by way of attenuating electrical power to a cell, group of cells, or corresponding memory devices (304), or like mechanism. Additionally, attenuation component 310 can disable groups of cells, established by a grouping component 312. More specifically, grouping component 312 can categorize groups of cells according to one or more program states. For example, each cell of a multi-cell memory device (304) can be tested to determine a program level of such cells, as described above (e.g., by measurement component 306). Each cell corresponding to a program state, or having an adjacent cell (e.g., where adjacent cells are different cells sharing a common multi-cell memory device) corresponding to a program state, or both, can be categorized into a particular group by grouping component 312.

For instance, to continue the preceding example in regard to a plurality of dual-cell, quad-bit memory devices (304), each memory device has two adjacent cells, that each can be programmed to one of 4 program states, e.g., B1, B2, B3, and B4. Grouping component can categorize one or more groups based on cell program states, such that all cells programmed to a B1 state form a first group, or all cells having an adjacent cell programmed to a B1 state form the first group, or all memory devices having one or both cells programmed to a B1 state form the first group, or the like, or combinations thereof. In the context of the subject example, where first program states overlap second program states, the first group can be formed of all cells and/or devices having a first or second program state (e.g., as determined with respect to the reference chosen between the second and third program state distributions by reference component 308, described above). A second group can be formed of all cells and/or devices having a second or third program state, etc.

It should be appreciated that some cells can be categorized within a single group or multiple groups by grouping component 312. A quad-bit, dual-cell memory device having one cell programmed to a first program state (e.g., B1) and a second cell programmed to a third program state (e.g., B3) could be included within both the first group and second group, as defined above, due to categorization based program states of adjacent cells of different program states (or, e.g., due to a memory device having cells programmed to states of different groups). Consequently, such a device and/or cells of such a device could be included within both the first group and the second group.

Other cell groups can be formed by grouping component 312 other than those outlined above. For instance, groups such as all cells not belonging to the first group (e.g., cells programmed to a third or fourth state, having adjacent cells also of a third or fourth state, or the like), cells not belonging to the second group, all cells having uniquely verified states (e.g., verified by measurement component 306, as described above), cells of a particular group have uniquely verified states, cells classified by measurement component 306, cells classified by measurement component 306 and also belonging to a particular group categorized by grouping component 312, or like groups, or any suitable combination thereof Subsequently, attenuation component 310 can iteratively disable groups of cells categorized by grouping component 312, so as to iteratively render at least one state distribution of at least one program state non-overlapped by distributions of other program states.

Consequently, bit verification component 302 can uniquely verify program states of programmed memory cells having overlapping distributions. More specifically, each overlapped distribution or groups of distributions can be iteratively rendered non-overlapped by disabling appropriate iterations of groups of programmed memory cells and/or related devices (304). An appropriate reference can be chosen with respect to the non-overlapped distribution (or group of distributions) so as to verify a state of such distribution(s). Subsequently, verified distributions can be categorized into additional groups by grouping component 312, and disabled to render other distributions non-overlapped, and therefore verifiable. In accord with aspects described herein, system 300 can therefore verify states of overlapping distributions of multi-cell memory devices, improving read capability and reliability in such devices.

FIGS. 4A and 4B through 8A and 8B depict exemplary state diagrams associated with a plurality of quad-bit, dual-cell memory devices in accord with aspects of the claimed subject matter. The state diagrams illustrate distinction and verification of overlapping state distributions, by measuring both cells of the dual-cell devices, identifying groups of distributions corresponding to particular program states, iteratively disabling one or more such groups to render other distributions non-overlapped, and iteratively verifying states of each such non-overlapped distribution. It should be appreciated that the illustrations provided by FIGS. 4A and 4B through 8A and 8B are but a single embodiment of the subject disclosure, and that state verification of overlapping distributions corresponding to like multi-bit, multi-cell memory devices is within the spirit and scope of the claimed subject matter.

Figure 4A:
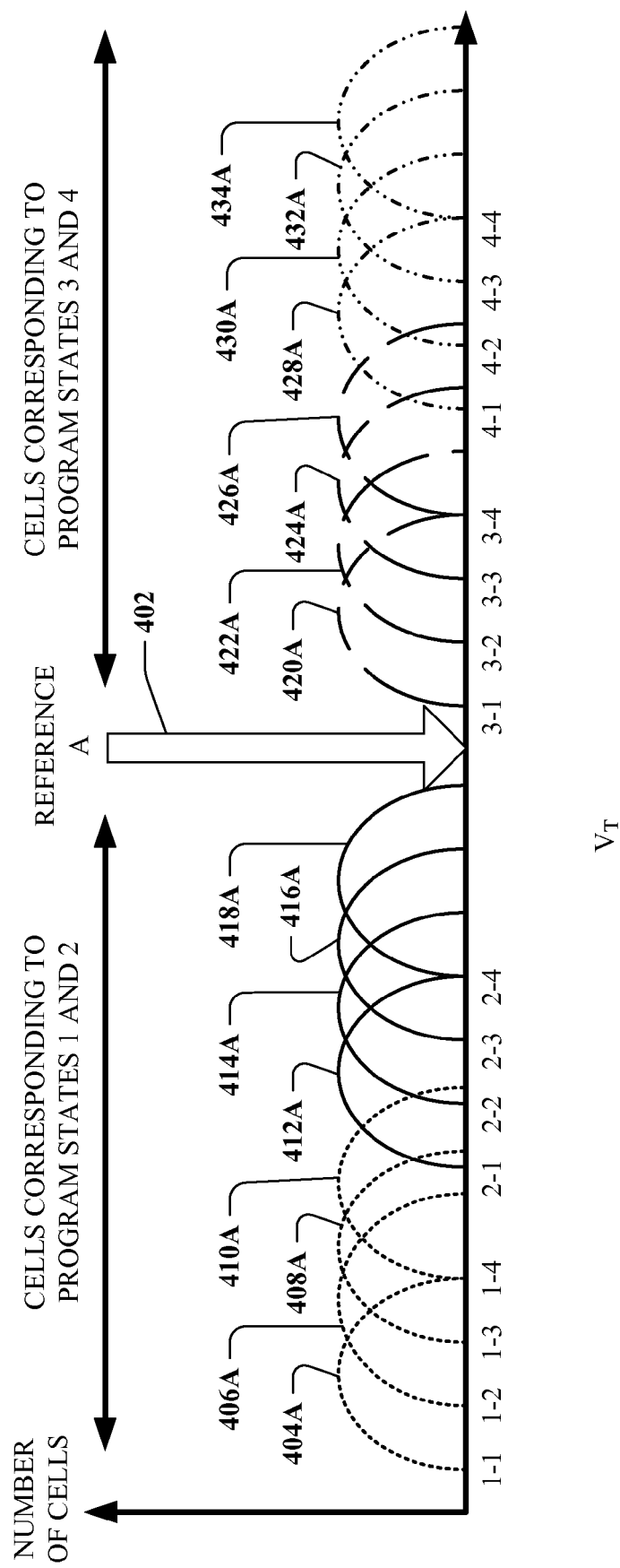
FIG. 4A illustrates an example depiction of overlapping state distributions of a plurality of multi-cell memory devices in accordance with aspects disclosed herein.

FIG. 4A illustrates an example depiction of overlapping state distributions of a plurality of multi-cell memory devices in accordance with aspects disclosed herein. The state distributions shown are on a graph of current (abscissa axis) v. a number of cells (ordinate axis) and correspond to program levels of a plurality of quad-bit, dual-cell memory devices. As depicted, distributions corresponding to each program state overlap at least one distribution corresponding to another state, rendering states of all distributions unverifiable via conventional techniques.

State distributions (404A, 406A, 408A, and 410A respectively) correspond to cells programmed to a first program level (e.g., B1 level) with adjacent cells in a first, second, third, and fourth program states, respectively. Such state distributions can also be referred to as 1-1, 1-2, 1-3, and 1-4 distributions, respectively. Distributions 412A, 414A, 416A, and 418A correspond to cells programmed to a second program state, having adjacent cells programmed to the first (2-1 state, 412), second (2-2 state, 414), third (2-3 state, 416) and fourth (2-4, state 418) program states, respectively. Likewise, distributions 420A, 422A, 424A, and 426A correspond to cells in a third state having adjacent cells in the first, second, third and fourth program states, respectively, and distributions 428A, 430A, 432A, and 434A correspond to cells in a fourth program state also having adjacent cells in the first, second, third and fourth program states, respectively.

For state distributions depicted by FIG. 4, no state can be uniquely verified because a distribution of every state overlaps a distribution of at least one other state. However, such states can be classified (e.g., by a measurement component 308, described in more detail at FIG. 3, supra) as belonging to a first or second program state, or to a third or fourth program state, by comparison with a reference 402 that bisects the non-overlapping second and third distributions. Additionally, a first cell group can be defined (e.g., by grouping component 308) that includes all cells that are programmed to the first or second state, or that are adjacent to such cells (or, e.g., sharing a common memory device with a cell programmed to the first or second state). By measuring both sides of a plurality of quad-bit, dual-cell memory devices (e.g., by measurement component 306), each cell or group of cells corresponding to such devices (and/or the memory device(s) themselves) having a first or second program state can be classified as belonging to the first group. For instance, all cells programmed to a first and second program state, and cells adjacent thereto, can be included in such first group, specifically all cells of first state distributions (404A-410A), second state distributions (412A-418A), and state distributions 3-1 (420A), 3-2 (422A), 4-1 (428A), and 4-2 (430A).

In addition, a second group can be defined (e.g., by grouping component 312) to include all cells programmed to a third or fourth program state, or cells adjacent to such cells. The second group could therefore include all cells corresponding to distributions of the third and fourth program states (420A-434A), and corresponding to state distributions 1-3 (408A), 1-4 (410A), 2-3 (416A), and 2-4 (418A). Note also that cells corresponding to the 1-3, 1-4, 2-3, 2-4, 3-1, 3-2, 4-1, and 4-2 state distributions (408A, 410A, 416A, 418A, 420A, 422A, 428A, and 430A, respectively) will belong to both the first and second groups simultaneously. Consequently, disabling the first group of cells can render state distributions corresponding to the second group non-overlapped, and vice versa.

Figure 4B:
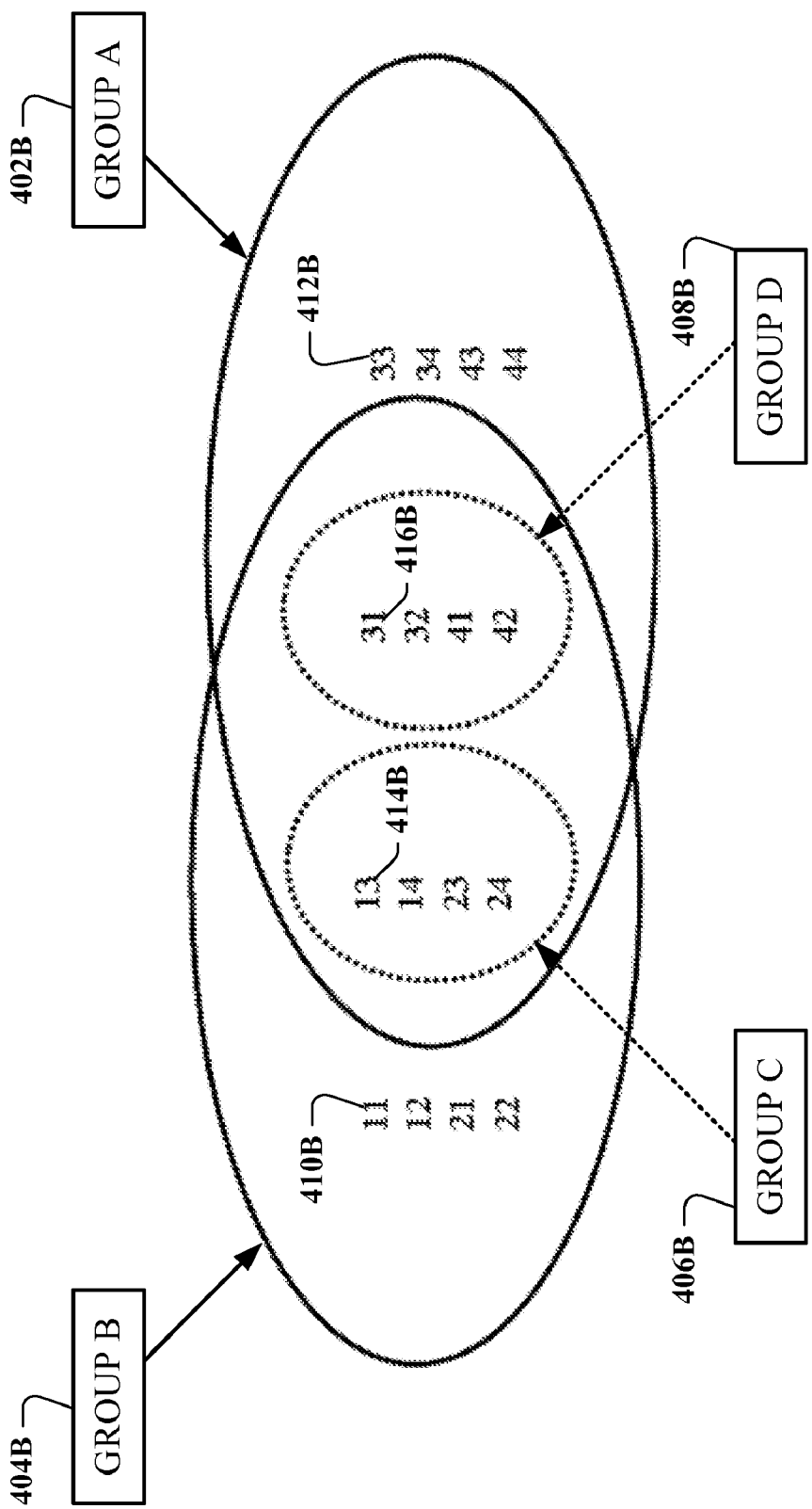
FIG. 4B depicts an example illustration of groups of overlapping state distributions in accord with aspects of the subject disclosure.

FIG. 4B depicts an example illustration of groups of memory cell state distributions in accord with aspects of the subject disclosure. Each cell distribution illustrated at FIG. 4A can correspond to a dual-cell memory device having a first cell state and second cell state of 1, 2, 3, or 4. Both cells of each memory device can be measured with respect to a reference that bisects non-overlapping distributions. For example, as indicated above at FIG. 4, each cell of a set of memory devices can be measured with respect to reference A (402) to determine whether such cell corresponds to a state greater than 2 (e.g., a 3 or 4 state) or less than 3 (e.g., a 1 or 2 state). Group A 402B, can include all memory cells having a first or second cell in a 3 or a 4 state, for instance. Additionally, Group B 404B, can include all memory cells having the first or second cell in a 1 or 2 state. Furthermore, a third group, Group C 406B can include all memory devices with the first cell in a 1 or 2 state and the second cell in a 3 or 4 state. Moreover, a fourth group, Group D 408B, can include all memory devices with the first cell in a 3 or 4 state and the second cell in a 1 or 2 state.

Groups A through D of FIG. 4B depict four specific sets of memory cell devices 410B-416B. Group A 402B includes memory devices 410B having cells in the 1/1, 1/2, 2/1, and 2/2 states. Group B 404B includes memory devices 412B having cells in the 3/3, 3/4, 4/3, and 4/4 states. In addition, Group C 406B can include memory devices 414B having cells in the 1/3, 1/4, 2/3, and 2/4 states. Moreover, Group D can include memory devices 416B having cells in the 3/1, 3/2, 4/1, and 4/2 states. Each set 410B-416B of memory cells can be independently disabled and/or enabled to facilitate rendering other sets 410B-416B non-overlapped in accord with aspects of the disclosure.

FIGS. 5A and 5B illustrate exemplary diagrams of a set 510B of state distributions rendered non-overlapped in accord with embodiments of the subject innovation. Referring to FIG. 5A, state distributions 504A, 506A, 512A, and 514A can correspond to 1-1, 1-2, 2-1, and 2-2 program states, respectively, of one or more quad-bit, multi-cell memory devices as described herein. Additionally, distributions depicted in FIG. 5A can result from disabling all devices having cells programmed to a third or fourth program state (e.g., all memory devices belonging to Group B 404B as defined at FIG. 4B, supra). As a result, only cells programmed to the first or second state, having adjacent cells also programmed to the first or second state are active. Such cells are represented by state distributions 1-1 504A, 1-2 506A, 2-1 512A, and 2-2 514A. Moreover, distributions 504A and 506A corresponding to a first program state can be distinguished from distributions 512A and 514A corresponding to a second program state. Consequently, a state of these distributions (501A, 506A, 512A, 514A) can be uniquely verified, for instance by comparison with a reference 502A between the 1-2 and 2-1 distributions (506A and 512A, respectively). Reference A 402 is indicated to correlate distributions 504A-514A with corresponding state distributions depicted at FIG. 4.

Referring to FIG. 5B, an example depiction of an active set 510B of memory cell devices is provided. Memory cell set 510B corresponds to active cells when all cells of Group A 502B (defined supra at FIG. 4B) are disabled. Memory devices included in Groups C and D (506, 508) are also included within Group A 502B and thus are disabled as well. In such a manner, a portion of Group B 504B including only memory devices of set 510B can be enabled to facilitate uniquely identifying states of memory devices of set 510B (e.g., by comparison with reference 502A).

Figure 6A:
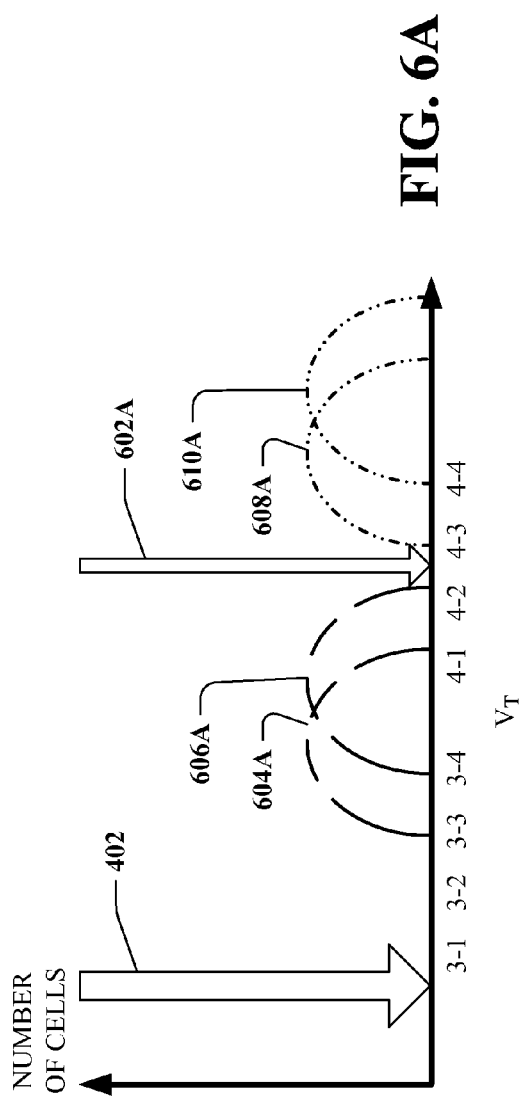
FIGS. 6A and 6B illustrate sample diagrams of state distributions rendered identifiable by iterative disablement of overlapping state distributions in accord with aspects disclosed herein.
Figure 6B:
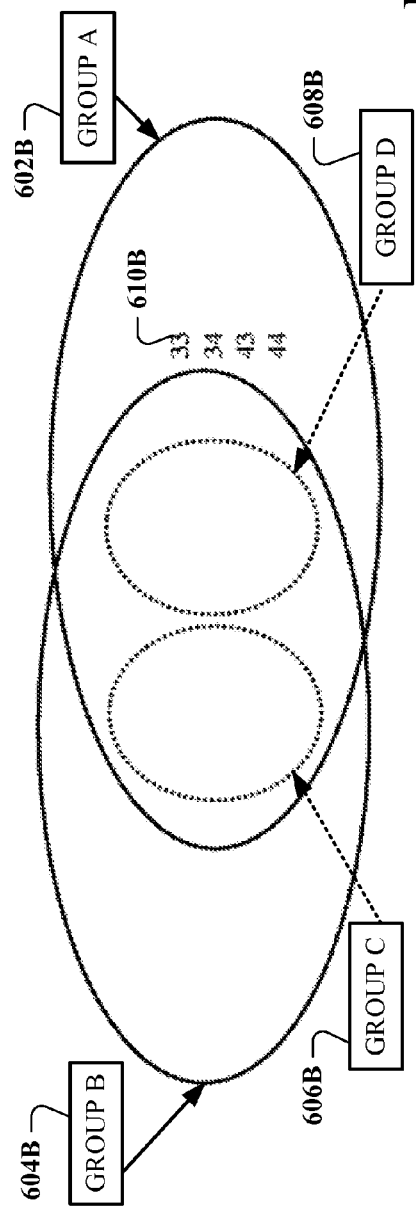
Figure 7A:
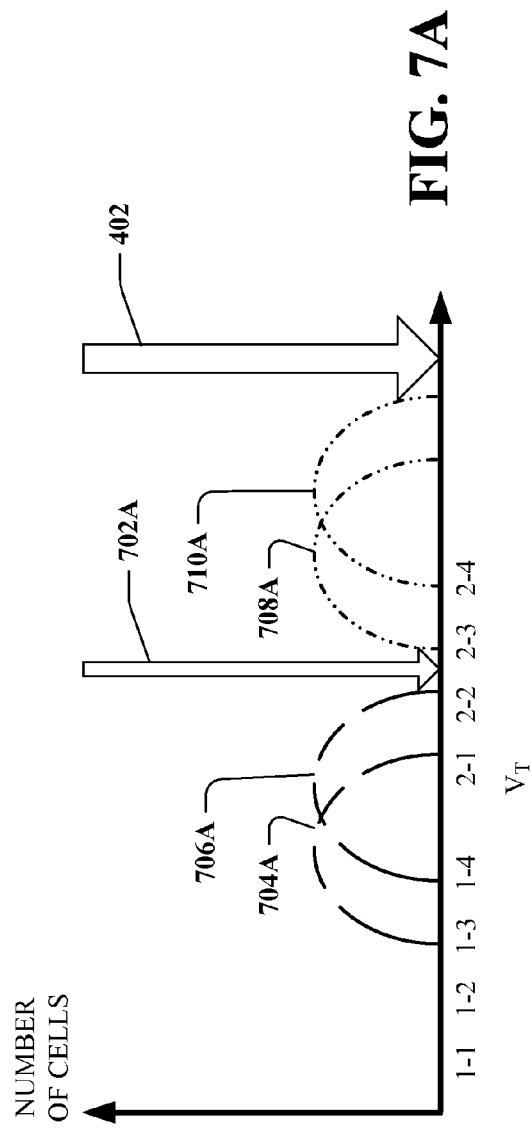
FIGS. 7A and 7B depict additional sample diagrams of state distributions rendered identifiable by disablement of cells corresponding to overlapping state distributions.
Figure 7B:
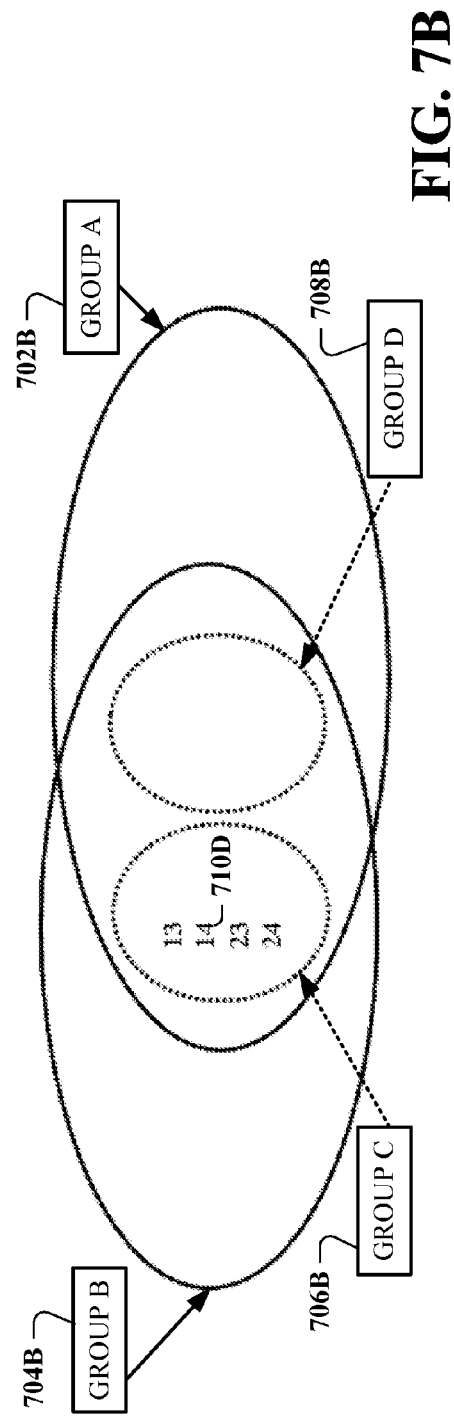

Referring to FIG. 6A, state distributions 604A, 606A, 608A, and 610A can correspond to 3-3, 3-4, 4-3, and 4-4 program states, respectively, of one or more quad-bit, multi-cell memory devices. Distributions depicted in FIG. 6A can result, for instance, from disabling all cells included within Group B 604B (e.g., as depicted at FIG. 6B, infra, formed by a grouping component 312, for instance) programmed, or adjacent to cells programmed, to a first or second program state. As a result, only cells programmed to the third or fourth state having adjacent cells also programmed to the third or fourth state are active in FIG. 6A. Moreover, states of such distributions 604A-610A can be distinguished and uniquely verified by comparison with reference 602A, for instance.

Referring to FIG. 6B, an example depiction of an active set 610B of memory cell devices is provided. Memory cell set 610B corresponds to active cells when all cells of Group B 604B (defined supra at FIG. 4B) are disabled. Memory devices included in Groups C and D (506, 508) are also included within Group B 504B and thus are disabled as well. In such a manner, a portion of Group A 602B including only memory devices of set 510B can be enabled to facilitate uniquely identifying states of memory devices of set 510B (e.g., by comparison to reference 602A).

Distributions uniquely verified as having a particular program state (e.g., as determined by comparison of distributions of non-overlapping states with a reference, as discussed supra with respect to memory devices of sets 510B and 610B, for instance) can further be included within a particular group (e.g., by a grouping component 312) that can be disabled. For instance, state distributions 504A-510A and 604A-610A of FIGS. 5A and 6A respectively, can be included within an additional program group, a verified program group for instance. This verified group of distributions, having uniquely verified states associated therewith, can be disabled in order to render other state distributions corresponding, for instance, with non-verified state distributions, non-overlapped. Consequently, verifying distributions, grouping them, and disabling them can facilitate verification of other overlapping cell state distributions of a plurality of multi-cell memory devices, as described herein.

Referring to FIGS. 7A, 7B, 8A and 8B, state distributions 704A, 706A, 708A, and 710A can correspond to 1-3, 1-4, 2-3, and 2-4 program states, respectively, of one or more quad-bit, multi-cell memory devices. In addition, state distributions 804A, 806A, 808A, and 810A can correspond to 3-1, 3-2, 4-1, and 4-2 program states, respectively, of one or more such memory devices. Distributions depicted at FIGS. 7A and 8A can result, for instance, from enabling all cells included within Group C 706B (806B) only or within Group D 808B (708B) only, respectively. Alternatively, such distributions can result from disabling a verified group of devices, discussed above, and subsequently disabling either Group B 704B, 804B or Group A 702B, 802B, respectively. As a result, only cells contained within sets 710B and 810B, respectively, are active under such circumstances. States of such active distributions 704A-710A or 804A-810A, respectively, can be distinguished and uniquely verified by comparison with reference 702A or 802A, respectively, for instance.

As stated previously, the described systems provide for distinguishing overlapping distributions of memory cells. For instance, by disabling memory cells having particular bit levels, sensing margins between state distributions can be widened. Consequently, reference levels can be determined between state distributions and bit levels associated with such distributions can be identified. As a result bit error rates (BER) and/or delta/sigma ratio of the distributions of each level associated with multi-cell, multi-bit memory devices can be improved.

Figure 9:
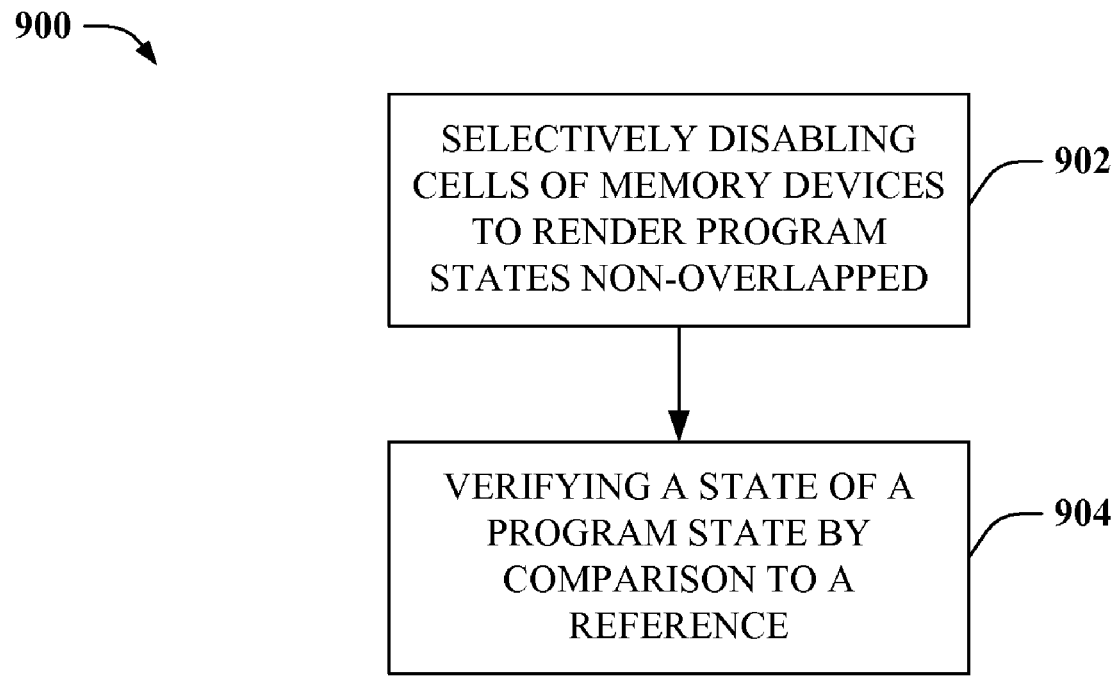
FIG. 9 illustrates a high level flowchart of an example methodology for distinguishing overlapping states of a plurality of multi-cell state distributions in accord with embodiments of the subject innovation.
Figure 10:
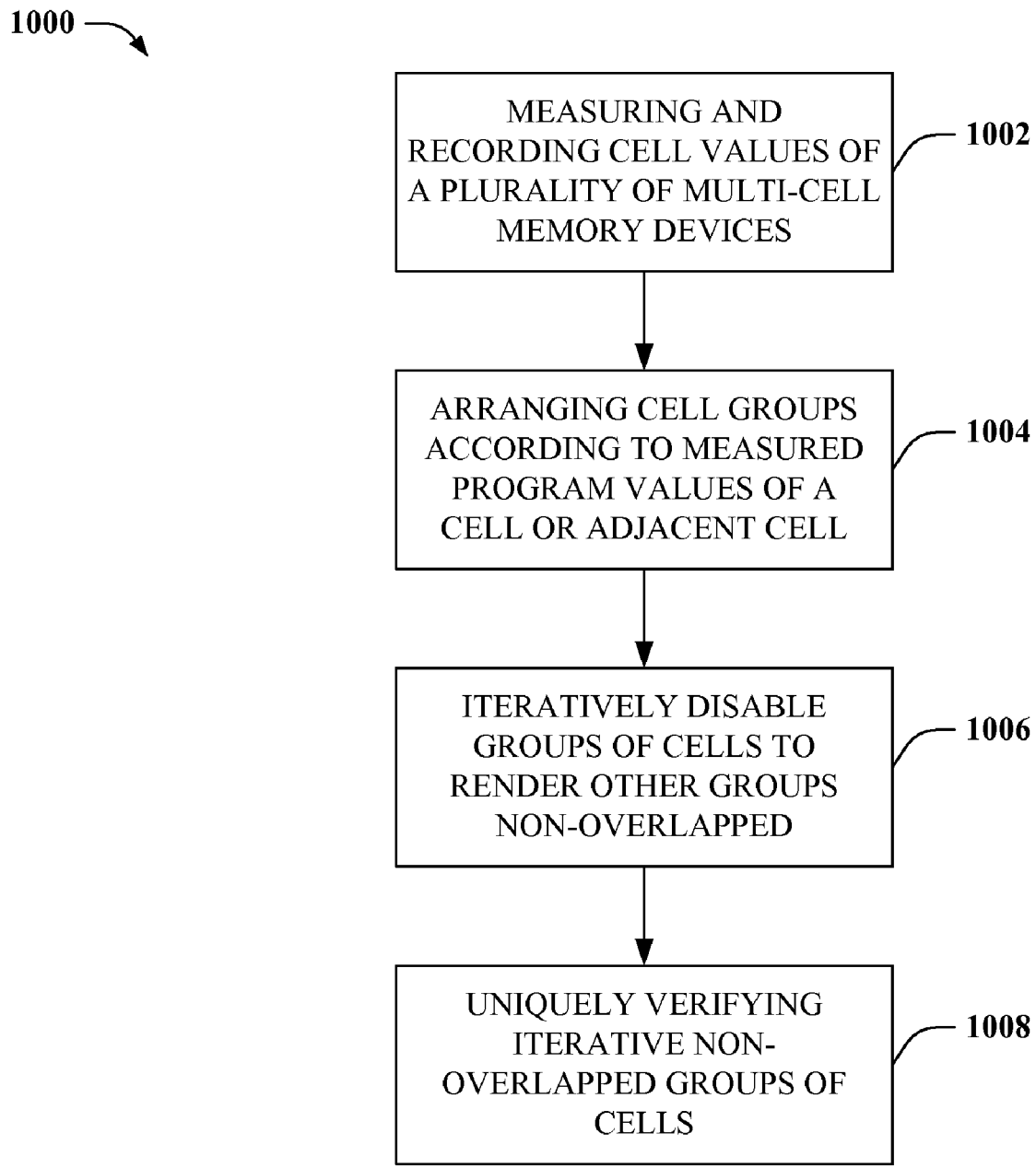
FIG. 10 illustrates an exemplary flowchart of a sample methodology for iteratively disabling groups of overlapping state distributions to facilitate reading multi-cell memory devices in accord with embodiments described herein.
Figure 11:
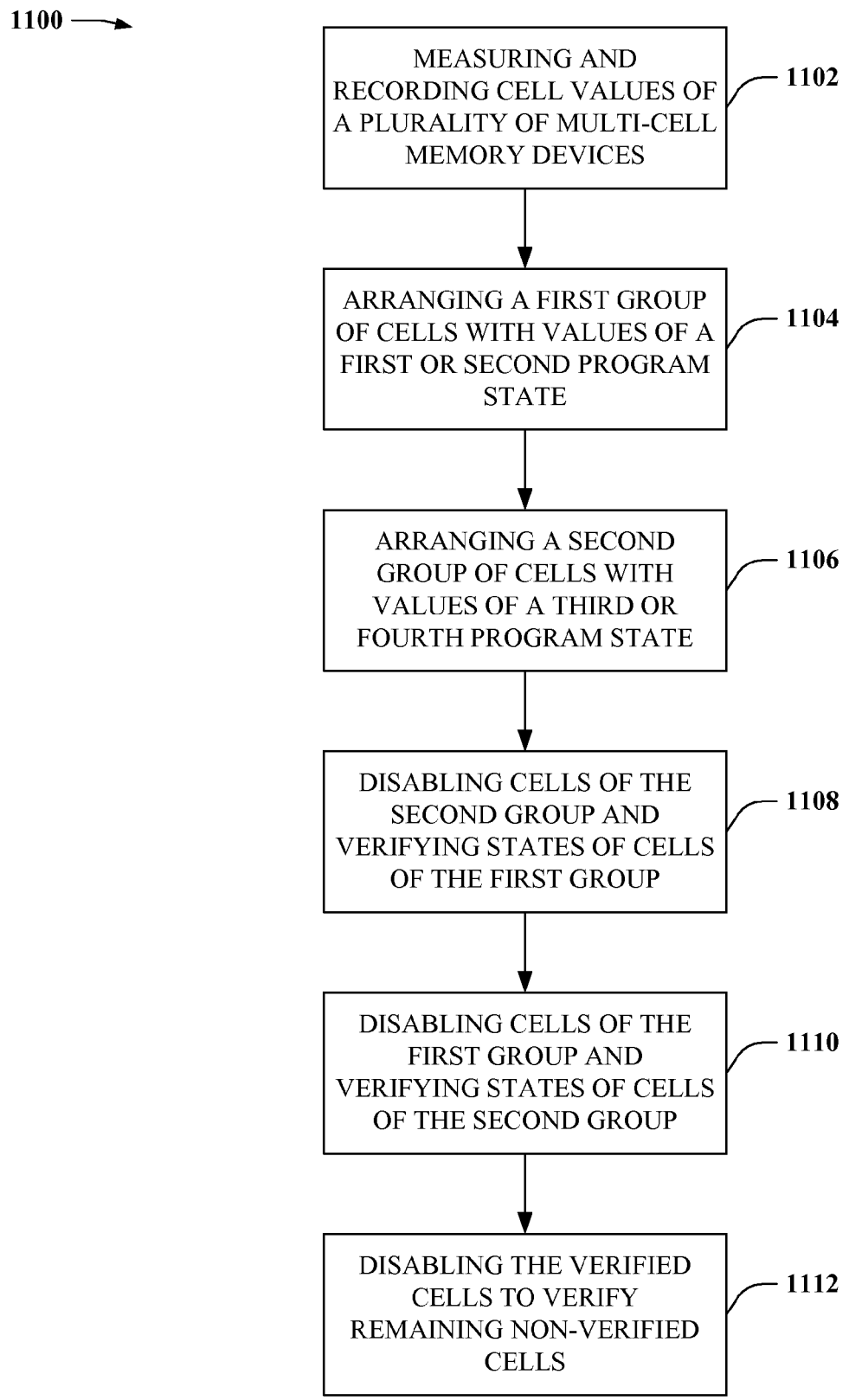
FIG. 11 depicts a flowchart of an example methodology for measuring, disabling, and identifying states of memory cells and/or complementary cells in accord with aspects of the claimed subject matter.

FIGS. 9-11 illustrate example methodologies in accordance with the disclosed subject matter. For purposes of simplicity of explanation, the methodologies are depicted and described as a series of acts. It is to be understood and appreciated that the claimed subject matter is not limited by the acts illustrated and/or by the order of acts, for acts associated with the example methodologies can occur in different orders and/or concurrently with other acts not presented and described herein. For example, those skilled in the art will understand and appreciate that a methodology could alternatively be represented as a series of interrelated states or events, such as in a state diagram. Moreover, not all illustrated acts can be required to implement a methodology in accordance with the claimed subject matter. Additionally, it should be further appreciated that the methodologies disclosed hereinafter and throughout this specification are capable of being stored on an article of manufacture to facilitate transporting and transferring such methodologies to computers.

FIG. 9 depicts a high level flowchart of an example methodology for distinguishing overlapping states of a plurality of multi-cell state distributions in accord with embodiments of the subject innovation. At 902, cells of memory devices can be selectively disabled to render program states of a plurality of multi-cell memory devices non-overlapped. Such multi-cell memory devices can include non-volatile memory, such as flash memory, ROM, PROM, EPROM, EEPROM, and the like. Furthermore, such multi-cell memory devices can include multi-level, multi-bit flash memory cells that can typically be programmed to multiple target levels that can represent multiple data bits. As a more specific example, a cell of a multi cell memory device can be programmed to multiple bit states, such as a quad-bit cell that can be programmed to four discreet levels (e.g., B1, B2, B3, B4) corresponding to varying amounts of voltage (or, e.g., electric charge, current, etc.) stored within a memory cell. For example, B1 can correspond to an unprogrammed state, B2 to a programmed state having a $V_T$ higher than B1, B3 to a programmed state having a $V_T$ higher than B1 and B2, and B4 to a highest programmed state having a $V_T$ still higher than B1, B2, and B3.

Cells can be disabled in accord with reference number 902 by, for example, attenuating power to such cells and/or to a memory device associated with such cells. More specifically, cells corresponding to one or more state distribution associated with a first program state, that overlap one or more distribution of a second state, can be disabled so as to render the second state and the first state distinct. At 904, a state of at least one program state rendered non-overlapped can be verified by comparison to at least one reference. A reference can be chosen between state distributions of non-overlapping states, providing a relative measure of distributions of such states. Consequently, distributions of each state can be distinguished from other states, facilitating identification of a unique state corresponding with each state distribution. By way of such mechanisms, methodology 900 can distinguish and verify states of overlapping state distributions in accordance with aspects of the subject innovation.

FIG. 10 illustrates an exemplary flowchart of a sample methodology for iteratively disabling groups of overlapping state distributions to facilitate reading multi-cell memory devices in accord with embodiments described herein. At 1002, cell values of a plurality of multi-cell memory devices can be measured and recorded. For example, a measurement component (e.g., current meter, charge meter, voltage meter, or like process, processor or combination of both) can identify a program level associated with each cell of the plurality of multi-cell memory devices, and record such levels. At 1004, cell groups can be arranged according to measured program values of a cell or an adjacent cell. For instance, a first program state group can include cells programmed to such first state, one or more cells adjacent to a cell programmed to the first state, or both. Alternatively, a program group can include cells programmed to one of multiple states, or cells adjacent to such cells programmed to one of multiple states. As a specific example, a cell group can include cells programmed to a third or fourth program states, or cells adjacent to cells programmed to the third or fourth program states, or both. Additional associations between cells can be utilized to form a cell group within the spirit and scope of the claimed subject matter, and consequently the subject disclosure should not be construed so as to be limited to the specific embodiments articulated herein.

At 1006, groups of cells can be iteratively disabled to render other groups of cells non-overlapped. At 1008, groups of cells iteratively rendered non-overlapped can be uniquely verified. For example, such non-overlapped groups of cells can be compared with a reference bisecting state distributions of such groups of cells and other groups of cells. By iteratively disabling select groups of cells, iteratively rendering groups of cells non-overlapped, and iteratively verifying such non-overlapped groups of cells, methodology 1000 can facilitate verification of memory cells of a plurality of multi-cell memory devices having overlapping state distributions.

FIG. 11 depicts a flowchart of an example methodology for measuring, disabling, and identifying states of memory cells and/or complementary cells in accord with aspects of the claimed subject matter. At 1102, cell values of a plurality of multi-cell memory devices can be measured and recorded. At 1104, a first group of cells with values of a first or second program state can be arranged. Also included in the first group of cells can be cells adjacent to the cells having values of a first or second program states. At 1106, a second group of cells with values of a third or fourth program state can be arranged. Included within the second group can also be cells adjacent to the cells with values of a third or fourth program state. At 1108, cells of the second group can be disabled and states of remaining cells of the first group can be verified (e.g., by comparison with one or more references). At 1110, cells of the first group can be disabled and remaining cells of the second group can be verified. At 1112, the cells verified at reference numbers 1108 and 1110 can be disabled to verify remaining, non-verified cells.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

As utilized herein, terms "component," "system," "interface," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Moreover, the word "exemplary" is used herein to mean serving as an example, instance, or illustration. Any aspect or design described herein as "exemplary" is not necessarily to be construed as preferred or advantageous over other aspects or designs. Additionally, some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

Figure 12:
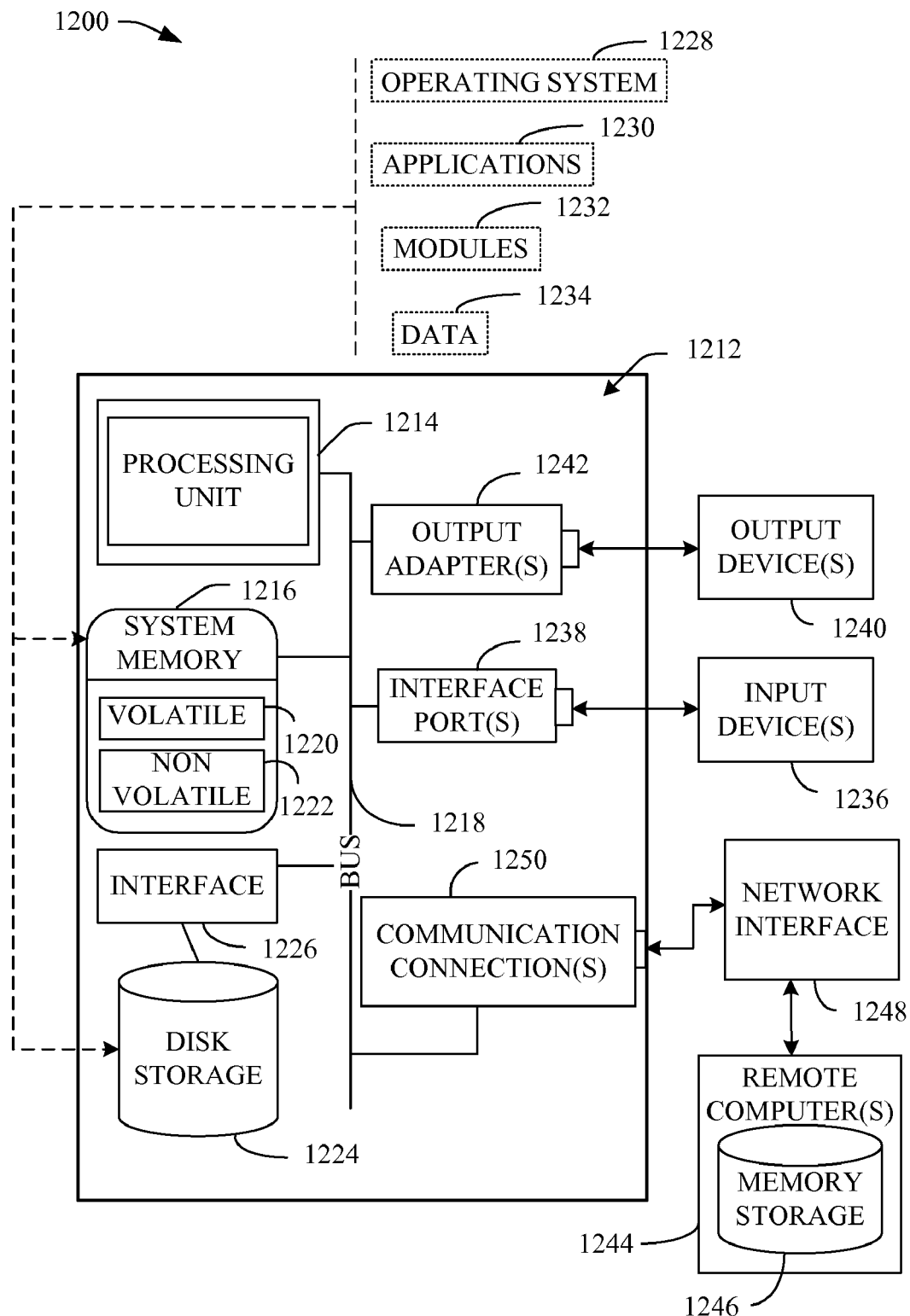
FIG. 12 illustrates a sample operating environment that can facilitate logical operations described in embodiments of the subject innovation.
Figure 13:
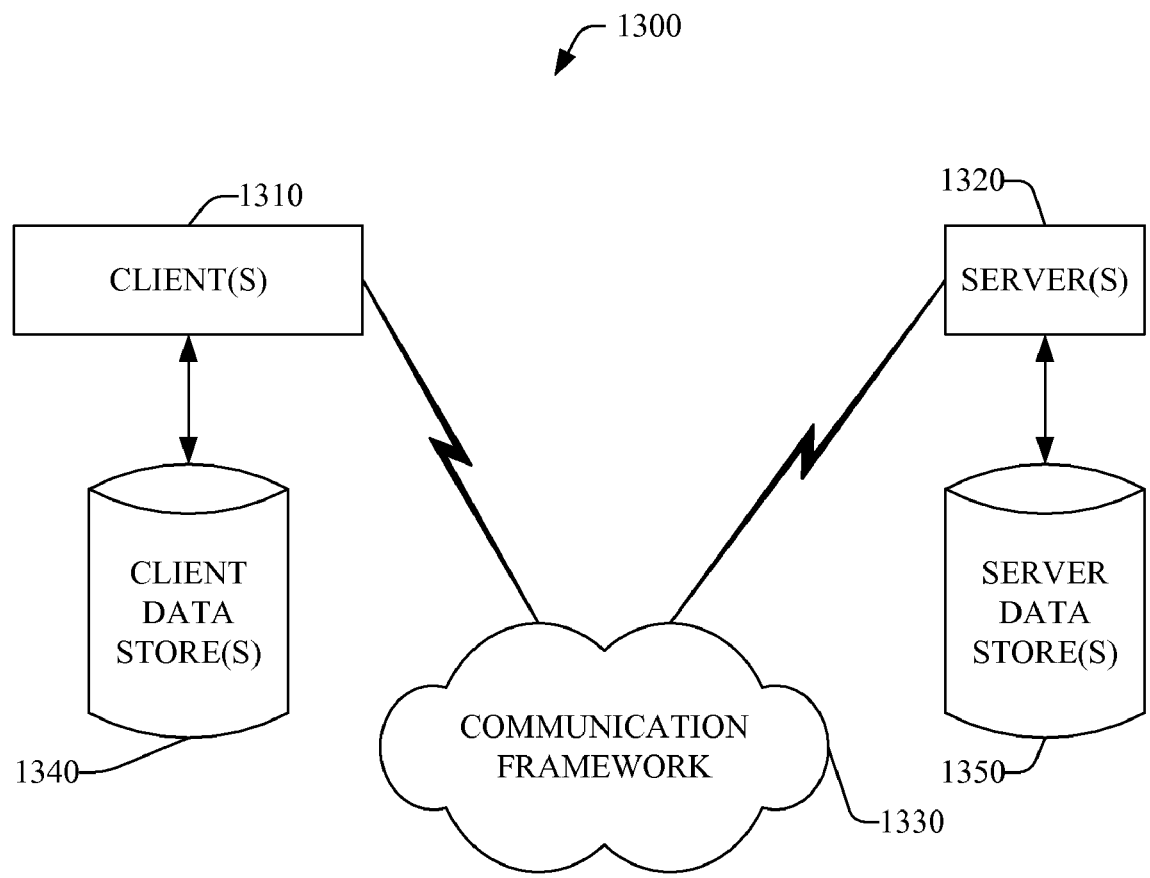
FIG. 13 depicts an exemplary network environment suitable for remote communication in accord with aspects described herein.

In order to provide a context for the various aspects of the disclosed subject matter, FIGS. 12 and 13, as well as the following discussion, are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone computers. In a distributed computing environment, program modules may be located in both local and remote memory storage devices.

With reference to FIG. 12, a suitable environment 1200 for implementing various aspects of the claimed subject matter can include a computer 1212. The computer 1212 includes a processing unit 1214, a system memory 1216, and a system bus 1218. The system bus 1218 couples system components including, but not limited to, the system memory 1216 to the processing unit 1214. The processing unit 1214 can be any of various available processors. Dual microprocessors and other multiprocessor architectures also can be employed as the processing unit 1214.

The system bus 1218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1216 includes volatile memory 1220 and nonvolatile memory 1222. The basic input/output system (BIOS), containing the basic routines to transfer information between elements within the computer 1212, such as during start-up, is stored in nonvolatile memory 1222. By way of illustration, and not limitation, nonvolatile memory 1222 can include ROM, PROM, electrically programmable ROM (EPROM), electrically erasable programmable ROM (EEPROM), or flash memory. Volatile memory 1220 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1212 also includes removable/non-removable, volatile/non-volatile computer storage media. FIG. 12 illustrates, for example, a disk storage 1224. Disk storage 1224 includes, but is not limited to, devices like a magnetic disk drive, floppy disk drive, tape drive, Jaz drive, Zip drive, LS-100 drive, flash memory card, or memory stick. In addition, disk storage 1224 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1224 to the system bus 1218, a removable or non-removable interface is typically used, such as interface 1226.

It is to be appreciated that FIG. 12 describes software that acts as an intermediary between users and the basic computer resources described in the suitable operating environment 1200. Such software includes an operating system 1228. Operating system 1228, which can be stored on disk storage 1224, acts to control and allocate resources of the computer system 1212. System applications 1230 take advantage of the management of resources by operating system 1228 through program modules 1232 and program data 1234 stored either in system memory 1216 or on disk storage 1224. It is to be appreciated that the disclosed subject matter can be implemented with various operating systems or combinations of operating systems.

A user enters commands or information into the computer 1212 through input device(s) 1236. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1214 through the system bus 1218 via interface port(s) 1238. Interface port(s) 1238 include, for example, a serial port, a parallel port, a game port, and a universal serial bus (USB). Output device(s) 1240 use some of the same type of ports as input device(s) 1236. Thus, for example, a USB port may be used to provide input to computer 1212 and to output information from computer 1212 to an output device 1240. Output adapter 1242 is provided to illustrate that there are some output devices 1240 like monitors, speakers, and printers, among other output devices 1240, which require special adapters. The output adapters 1242 include, by way of illustration and not limitation, video and sound cards that provide a means of connection between the output device 1240 and the system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. The remote computer(s) 1244 can be a personal computer, a server, a router, a network PC, a workstation, a microprocessor based appliance, a peer device or other common network node and the like, and typically includes many or all of the elements described relative to computer 1212. For purposes of brevity, only a memory storage device 1246 is illustrated with remote computer(s) 1244. Remote computer(s) 1244 is logically connected to computer 1212 through a network interface 1248 and then physically connected via communication connection 1250. Network interface 1248 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1250 refers to the hardware/software employed to connect the network interface 1248 to the bus 1218. While communication connection 1250 is shown for illustrative clarity inside computer 1212, it can also be external to computer 1212. The hardware/software necessary for connection to the network interface 1248 includes, for exemplary purposes only, internal and external technologies such as, modems including regular telephone grade modems, cable modems and DSL modems, ISDN adapters, and Ethernet cards.

FIG. 13 is a schematic block diagram of a sample-computing environment 1300 with which the subject innovation can interact. The system 1300 includes one or more client(s) 1310. The client(s) 1310 can be hardware and/or software (e.g., threads, processes, computing devices). The system 1300 also includes one or more server(s) 1320. Thus, system 1300 can correspond to a two-tier client server model or a multi-tier model (e.g., client, middle tier server, data server), amongst other models. The server(s) 1320 can also be hardware and/or software (e.g., threads, processes, computing devices). The servers 1320 can house threads to perform transformations by employing the subject innovation, for example. One possible communication between a client 1310 and a server 1320 may be in the form of a data packet transmitted between two or more computer processes.

The system 1300 includes a communication framework 1330 that can be employed to facilitate communications between the client(s) 1310 and the server(s) 1320. The client(s) 1310 are operatively connected to one or more client data store(s) 1340 that can be employed to store information local to the client(s) 1310. Similarly, the server(s) 1320 are operatively connected to one or more server data store(s) 1350 that can be employed to store information local to the servers 1320.

What has been described above includes examples of the various embodiments. It is, of course, not possible to describe every conceivable combination of components or methodologies for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments includes a system as well as a computer-readable medium having computer-executable instructions for performing the acts and/or events of the various methods. In addition, while a particular feature may have been disclosed with respect to only one of several implementations, such feature may be combined with one or more other features of the other implementations as may be desired and advantageous for any given or particular application.

What is claimed is:

1. A system that identifies states of multi-cell memory devices, comprising:
   a attenuation component that iteratively disables one or more programmed cells of a plurality of multi-cell memory devices, wherein an iteration of disabled cells renders at least one program state non-overlapped; and
   a measurement component that verifies a state associated with the at least one non-overlapped program state.

2. The system of claim 1, comprising a reference component that generates a reference between non-overlapped states of programmed cells.

3. The system of claim 2, the measurement component verifies a state of the programmed cells by comparing measured values of the programmed cells to the reference.

4. The system of claim 1, the disabled cells correspond to overlapping state distributions of the plurality of multi-cell memory devices, or are adjacent to cells corresponding to such overlapping state distributions, or both.

5. The system of claim 1, comprising a grouping component that categorizes groups of cells corresponding to one or more programmed states.

6. The system of claim 5, the attenuation component disables programmed cells corresponding to one or more groups of cells classified by the grouping component.

7. The system of claim 5, the grouping component classifies a first group that corresponds to cells of a first and second programmed state and cells adjacent thereto, and a second group that corresponds to cells of a third and fourth programmed state and cells adjacent thereto.

8. The system of claim 7, the grouping component further classifies a third group of cells, states of which are verified by the measurement component while the first group is disabled by the attenuation component, and a fourth group of cells, states of which are verified by the measurement component while the second group is disabled by the attenuation component.

9. The system of claim 8, the iteration of disabled cells includes the first, second, third, or fourth group of programmed cells, or a combination thereof.

10. A method for identifying potentially overlapping cell states of a plurality of multi-cell memory devices, comprising:
    selectively disabling programmed cells of a plurality of multi-cell memory devices so as to iteratively render at least one program state non-overlapped; and verifying a state of the at least one non-overlapped program state by comparison to one or more references.

11. The method of claim 10, comprising measuring and recording a program value of each cell.

12. The method of claim 10, comprising arranging groups of cells according to a measured program value of a cell or of an adjacent cell.

13. The method of claim 11, comprising arranging a first group of cells that includes cells having a programmed value less than a reference, and cells that are adjacent to the cells having the programmed value less than the reference, and a second group of cells that includes cells having a programmed value greater than the reference and cells that are adjacent to the cells having the programmed value greater than the reference.

14. The method of claim 13, comprising disabling the first group of cells so as to uniquely verify a state of cells of non-disabled cells of the second group rendered non-overlapped by the disabling.

15. The method of claim 13, comprising disabling the second group of cells so as to uniquely verify a state of non-disabled cells of the first group rendered non-overlapped by the disabling.

16. The method of claims 13, comprising disabling verified cells of the first group or the second group so as to render non-verified cells of the first and second groups non-overlapped.

17. The method of claim 16, comprising uniquely verifying program states of the non-verified cells with respect to the reference or one or more additional references.

18. A system that provides measurement and verification of memory cells of multi-cell memory devices, comprising:
    means for suppressing groups of programmed cells of a plurality of multi-cell memory devices that separates overlapped state distributions by disabling groups of such distributions; and
    means for verifying a program state of a cell that uniquely identifies a state of one or more programmed cells associated with the separated state distributions.

19. The system of claim 18, comprising means for measuring a programmed value of one or more cells of the multi-cell memory devices.

20. The system of claim 19, comprising means for correlating cells that arranges the groups of programmed cells as a function of the programmed value of such cell or program state of an adjacent cell, or both, determined by the means for measuring.

* * * * *